US009639226B2

(12) United States Patent
Gradinariu

(10) Patent No.: US 9,639,226 B2
(45) Date of Patent: May 2, 2017

(54) DIFFERENTIAL SIGMA-DELTA CAPACITANCE SENSING DEVICES AND METHODS

(71) Applicant: Cypress Semiconductor Corporation, San Jose, CA (US)

(72) Inventor: Iulian C. Gradinariu, Colorado Springs, CO (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/965,165

(22) Filed: Dec. 10, 2015

(65) Prior Publication Data

US 2017/0060297 A1    Mar. 2, 2017

Related U.S. Application Data

(60) Provisional application No. 62/212,257, filed on Aug. 31, 2015.

(51) Int. Cl.
G06F 3/044        (2006.01)

(52) U.S. Cl.
CPC .................................. *G06F 3/044* (2013.01)

(58) Field of Classification Search
CPC ............................................ H03K 2217/9607
See application file for complete search history.

(56) References Cited

U.S. PATENT DOCUMENTS

| | | | |
|---|---|---|---|
| 6,300,776 B1 | 10/2001 | Schreiber et al. | |
| 6,400,295 B1 | 6/2002 | Van Herzeele | |
| 6,408,034 B1 | 6/2002 | Krone et al. | |
| 6,501,282 B1 * | 12/2002 | Dummermuth | G01D 5/24 324/658 |
| 6,583,632 B2 * | 6/2003 | Von Basse | G06K 9/0002 324/662 |
| 7,304,483 B2 | 12/2007 | O'Dowd et al. | |
| 7,504,876 B1 * | 3/2009 | Raghavan | G05F 3/205 327/536 |
| 7,746,160 B1 * | 6/2010 | Raghavan | G05F 3/205 327/534 |
| 8,072,230 B1 * | 12/2011 | Seguine | G06K 9/0002 324/663 |

(Continued)

OTHER PUBLICATIONS

Singh et al., A Compact Parasitic-Insensitive Dual-Frequency SigmaDelta Modulated CMOS Capacitive Sensor, Biomedical Circuits and Systems Conference (BioCAS), Nov. 3-5, 2010, pp. 242-245, IEEE.

(Continued)

*Primary Examiner* — Antonio Xavier

(57) ABSTRACT

A capacitance sensing device can include a reference circuit configured to connect to a reference capacitance, and to generate an electrical reference signal that varies over time according to the reference capacitance and a compare signal; a sense circuit configured to connect to a sense capacitance, and to generate an electrical sense signal that varies over time according to a sense capacitance; a compare circuit having compare inputs coupled to receive the sense signal and the reference signal, and a compare output that provides the compare signal; and a value generation circuit configured to generate an output value corresponding to the compare signal over a predetermined time period.

20 Claims, 11 Drawing Sheets

(56) References Cited

U.S. PATENT DOCUMENTS

| | | | |
|---|---|---|---|
| 8,085,085 B1* | 12/2011 | Srinivasa Raghavan | G05F 3/205 327/534 |
| 8,283,972 B1* | 10/2012 | Raghavan | G05F 3/205 327/536 |
| 8,537,107 B1* | 9/2013 | Li | G06F 3/023 178/18.03 |
| 8,547,114 B2 | 10/2013 | Kremin | |
| 8,570,053 B1* | 10/2013 | Ryshtun | H03K 17/962 324/678 |
| 8,587,365 B1* | 11/2013 | Srinivasa Raghavan | G05F 3/205 327/534 |
| 8,982,989 B2 | 3/2015 | Flanagan et al. | |
| 9,166,621 B2* | 10/2015 | Kremin | G06F 3/044 |
| 2003/0151450 A1* | 8/2003 | Nguyen | G06F 1/26 327/540 |
| 2006/0160511 A1* | 7/2006 | Trichy | G06F 13/4072 455/255 |
| 2008/0111714 A1* | 5/2008 | Kremin | G06F 3/044 341/33 |
| 2008/0143671 A1* | 6/2008 | Li | G06F 3/023 345/156 |
| 2008/0179112 A1* | 7/2008 | Qin | G06F 3/03547 178/18.06 |
| 2009/0008161 A1* | 1/2009 | Jones | G06F 3/044 178/18.06 |
| 2009/0009491 A1* | 1/2009 | Grivna | G06F 3/033 345/184 |
| 2009/0225044 A1* | 9/2009 | Jeon | G06F 3/0418 345/173 |
| 2011/0174959 A1* | 7/2011 | Geloven | G06F 3/0304 250/208.6 |
| 2011/0267212 A1* | 11/2011 | Denison | G01D 5/24 341/122 |
| 2012/0043970 A1* | 2/2012 | Olson | G01R 27/2605 324/601 |
| 2012/0217982 A1* | 8/2012 | Narayanasamy | H03K 17/962 324/686 |
| 2014/0049273 A1* | 2/2014 | Rocznik | G01R 27/2605 324/679 |
| 2014/0368222 A1* | 12/2014 | Curtis | G01D 5/2405 324/672 |
| 2015/0293625 A1* | 10/2015 | Narayanasamy | H03K 17/962 345/174 |

OTHER PUBLICATIONS

Texas Instruments Incorporated, Pressure Sensor Signal Condition, PGA400-Q1, 2012.

International Search Report for International Application No. PCT/US16/48220 dated Sep. 16, 2016; 3 pages.

Written Opinion of the International Searching Authority for International Application No. PCT/US16/48220 mailed Sep. 16, 2016; 3 pages.

* cited by examiner

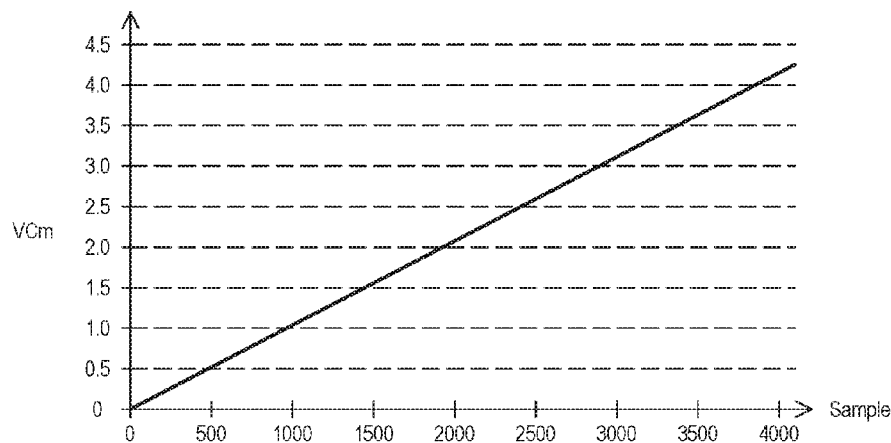
FIG. 4A
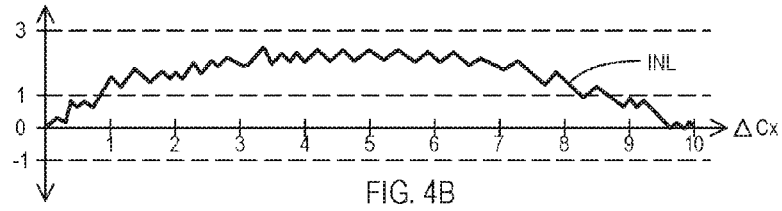
FIG. 4B
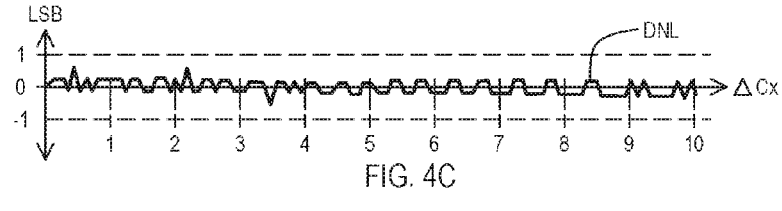
FIG. 4C
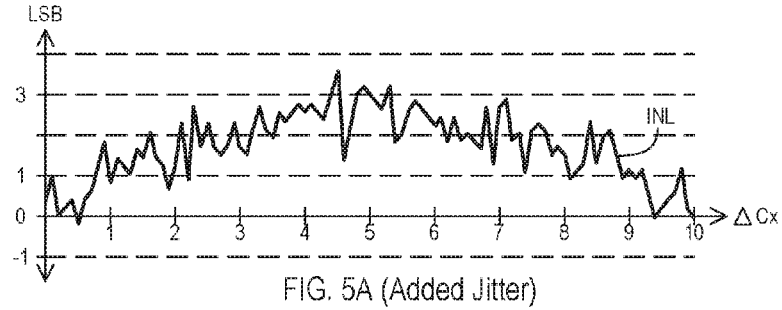
FIG. 5A (Added Jitter)
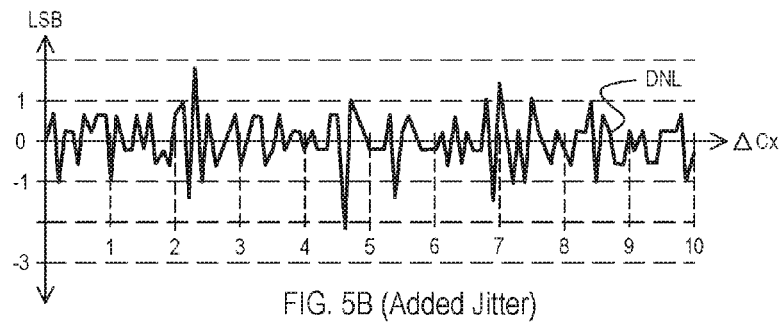
FIG. 5B (Added Jitter)

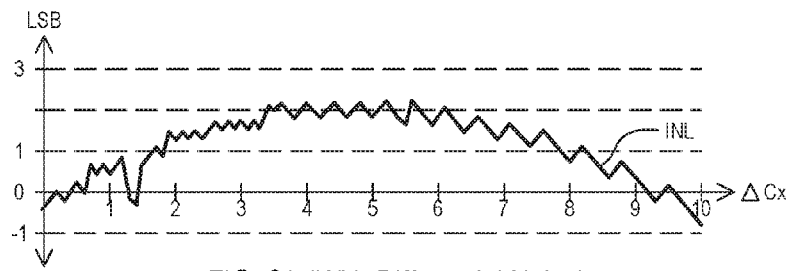
FIG. 6A (With Differential Noise)
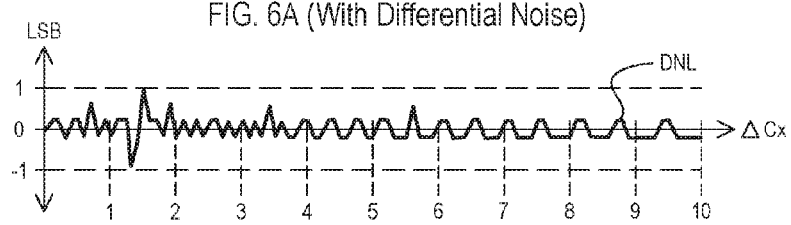
FIG. 6B (With Differential Noise)
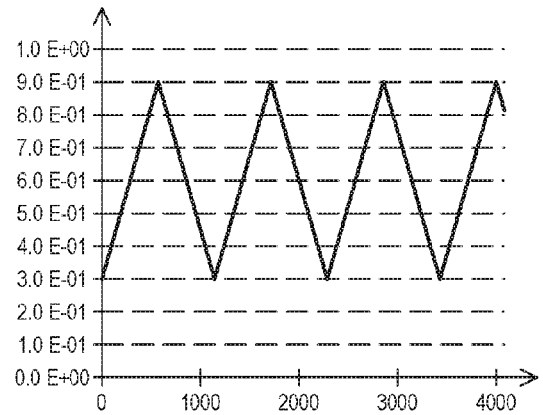
FIG. 7A
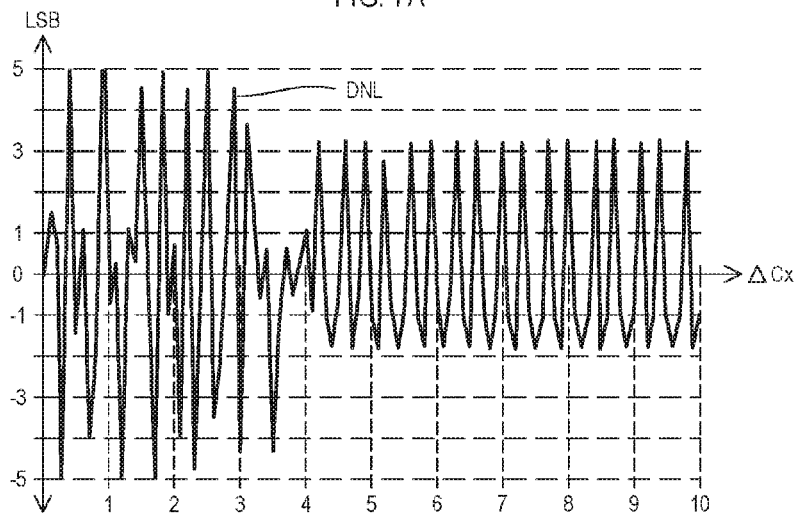
FIG. 7B

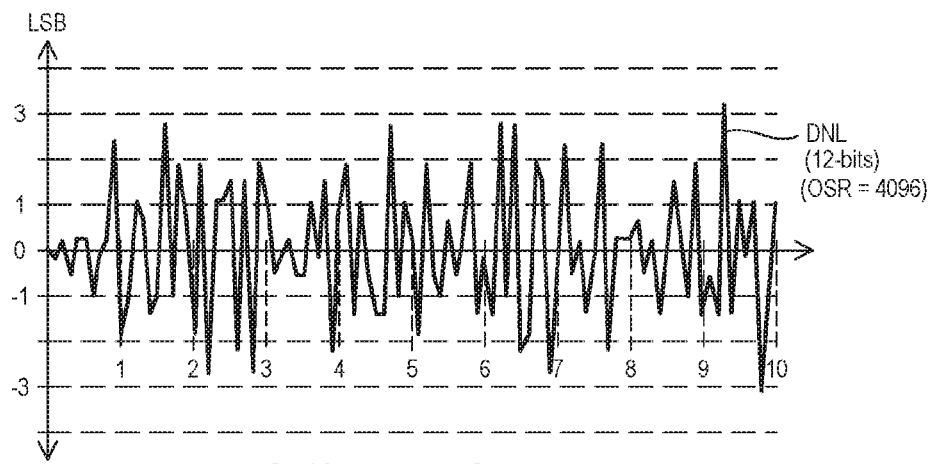
FIG. 10A (Added CLK Jitter)
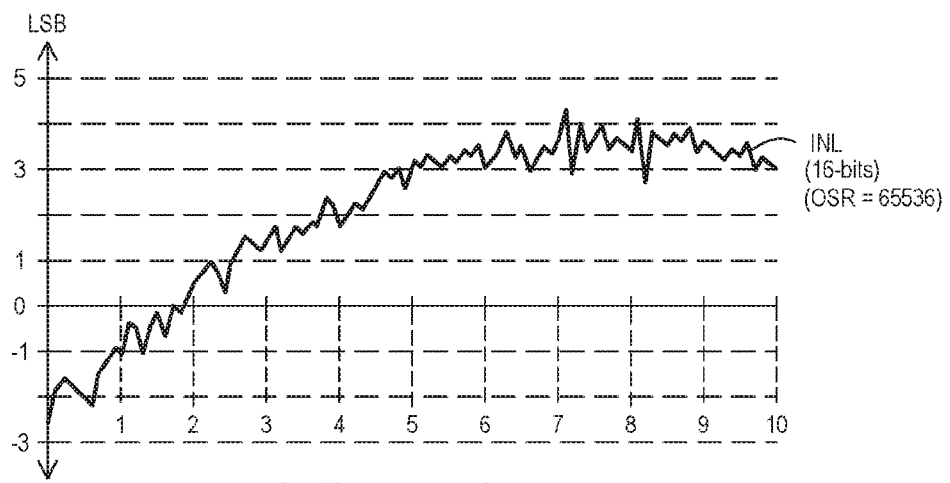
FIG. 10B (Added CLK Jitter)
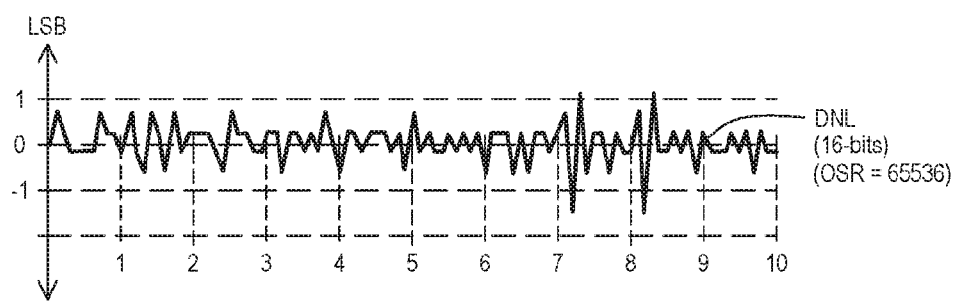
FIG. 10C (Added CLK Jitter)

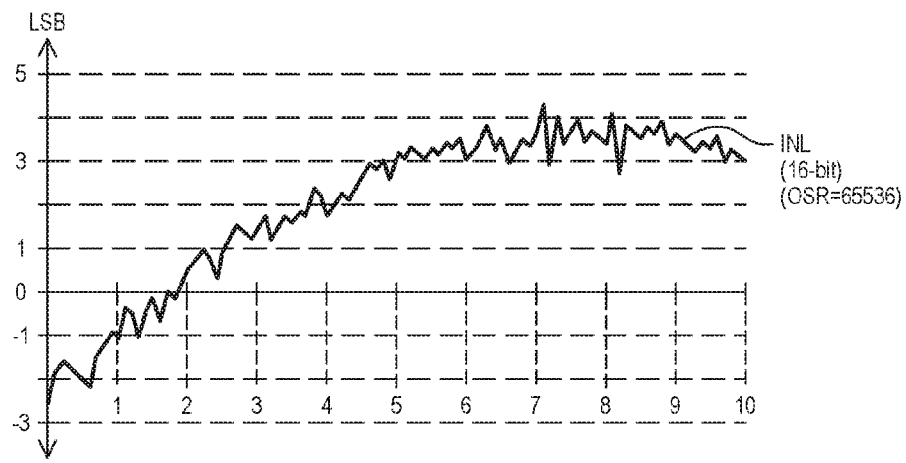
FIG. 11A (Added Clock Dithering)
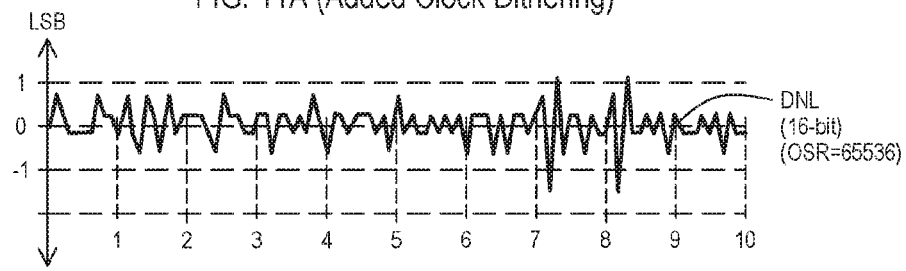
FIG. 11B (Added Clock Dithering)
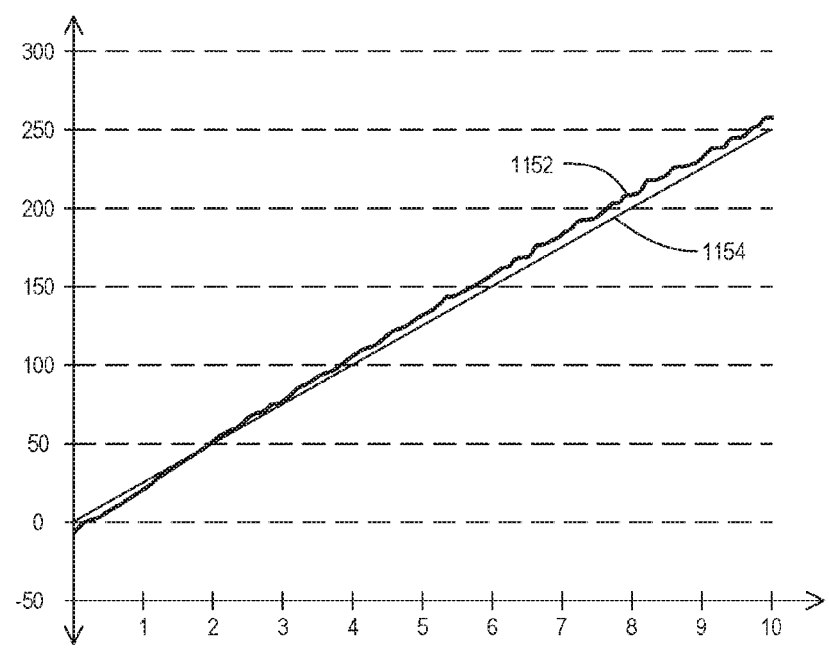
FIG. 11C (BACKGROUND)

(BACKGROUND)

DIFFERENTIAL SIGMA-DELTA CAPACITANCE SENSING DEVICES AND METHODS

CROSS-REFERENCE TO RELATED APPLICATIONS

This application claims the benefit of U.S. Provisional Patent Application Ser. No. 62/212,257 filed on Aug. 31, 2015, the contents of which are incorporated by reference herein.

TECHNICAL FIELD

The present disclosure relates generally to capacitive sensing methods and devices, and more particularly to capacitance sensing that utilizes "sigma-delta" type conversions to determine changes in capacitance.

BACKGROUND

Capacitive sensing technology can detect the proximity of objects from one another. For example, capacitive sensing technology is often used to detect a human body part (e.g., finger) position on a touch input device by measuring the capacitive coupling between the human finger and a capacitive sensor (e.g., touchscreen).

In some conventional capacitive sensing systems, a form of delta-sigma modulation can be used, with successive changes in the input signal over time being encoded into values. This is in contrast to other conventional approaches that can measure an actual value of the input signal. In the delta-sigma case, typically each encoded value can be a stream of bits, which can be integrated to provide a representation of the input signal.

A conventional sigma-delta capacitance sensing system 1800 is shown in FIG. 18A. Conventional system 1800 can sense changes in capacitance at a sense node 1801. Conventional system 1800 can include a current source 1803, a modulating switch 1805, a comparator 1807, logic 1809, a timer/counter 1811, and a sampling switch 1813. A modulating capacitance Cmod can be connected to sense node 1801 to provide a base capacitance. A variable capacitance for detection is shown as Cs.

FIG. 18B is a timing diagram showing an operation of system 1800. FIG. 18B includes a waveforms showing a sampling timer signal (Timer), a voltage at sense node 1801 (VCmod), an output of comparator 1807 (Comp Output), a counter value provided by timer/counter 1811 (Counter), and an integrating clock signal CLK.

Operations of a conventional system 1800 will now be described with reference to FIG. 18A in conjunction with FIG. 18B.

In the conventional approach shown in FIG. 18B, a sampling operation can involve a number of conversion cycles, each of which represents an integration of the capacitance at the sense node 1801 to generate a count value. Such count values are accumulated to generate a sample value.

At time t0, a Timer signal can go high, signaling the start of a sample operation and the start of a first conversion cycle. Sample switch 1813 can switch from a grounded position to one that connects a sampled capacitance Cs to sense node 1801. In the operation shown, VCmod is compared to a reference voltage Vref by comparator 1807. Because VCmod was previously grounded, it is less than Vref, and Comp Output is high. This enables modulating switch 1805, which causes current source 1803 to charge the sense node 1801. Logic 1809 outputs the high Comp Output value to time/counter 1811, which can increment a count value according to CLK.

At about time t1, VCmod can reach Vref. Consequently, comparator 1807 can drive Comp Output low. This disables modulating switch 1805, which isolates current source 1803 from sense node 1801, to stop the charging of sense node 1801. Logic 1809 latches the low Comp Output value, and forwards it to timer/counter 1811, which ceases incrementing its count. In the example shown, the count value is 8 (cycles of CLK).

At about time t2, a first conversion cycle can end. At this time, sample switch 1813 can discharge the sampled capacitance Cs to ground. A sense node 1801 may also be discharged to ground. As shown, a conventional conversion cycle can be from 0.2 to 10 us.

At time t3, a second conversion cycle starts and proceeds as described for the first conversion cycle. However, in the second conversion cycle the accumulated count is 11, for an overall counter value of 19.

At time t4, a last conversion cycle is complete, with the Timer signal going low. As shown, the total sample raw count is 3504, which represents a total of the integrations performed at the sense node 1801 over all the conversion cycles of the sample operation. Sequences of raw sample counts derived in this manner can indicate any changes in Cs.

A drawback to a conventional approach, like that of FIGS. 18A and 18B, can be the sensitivity of the system to variations in reference levels and timing clocks. In particular, a sensitivity of a conventional capacitive sensing system like that of FIG. 18A can be given by $$\text{Sensitivity} = (\Delta RC/\Delta Cs) = (Vref*Fs/Idac)*(2n-1)$$

where $\Delta RC$ is the raw count provided by a variation of $\Delta Cs$ in the sample capacitance. Fs can be the frequency of integrating clock signal CLK, Idac is the current provided by current source 1803, and n is the number of samples.

From the above, it can be seen that any short term variation (e.g., noise) in Vref or Fs translates into a proportional $\Delta RC$ error. In order to sense a 0.1% $\Delta Cs$ sense capacitance variation, Vref and Fs are required to vary less than 0.01% for the duration of the measurement cycle. As a result, conventional approaches can employ low noise reference generators to ensure strict Vref values, as well as low jitter, high stability oscillators to ensure CLK is maintained as close as possible to a desired Fs.

Conventional approaches can also have conversion transfer functions that vary considerably from an ideal conversion result. In particular, a conventional transfer function can have "flat" regions, instead of a linear response. To address such flat regions, conventional approaches can utilize clock dithering, which requires additional circuits to alter the sampling clock. Further, due to the high dependence upon an accurate reference voltage, conventional approaches can require periodic recalibration.

It is noted that the conventional circuit 1800 can be considered not to be a "true" sigma-delta converter, as its output depends upon the clock frequency (i.e., Fs).

BRIEF DESCRIPTION OF THE DRAWINGS

FIGS. 4A to 4C are diagrams showing simulation results for a circuit like that of FIG. 3A.

FIGS. 5A and 5B are diagrams showing simulation results like that of FIGS. 4B and 4C, but with cycle-to-cycle jitter added.

FIGS. 6A and 6B are diagrams showing simulation results for a circuit like that of FIG. 3A, showing resistance to common-mode noise.

FIG. 7A is a diagram showing a continuous ramp operations of a capacitance sense circuit according to an embodiment. FIG. 7B is a diagram showing simulation results for a circuit like that of FIG. 7A.

FIGS. 10A to 10C are diagrams showing simulation results for an embodiment like that shown in FIG. 9 that adds jitter to a sampling clock to improve performance.

FIGS. 11A to 11C are diagrams showing simulation results for an embodiment like that shown in FIG. 9 that utilizes clock dithering to improve performance.

DETAILED DESCRIPTION

Figure 1A:
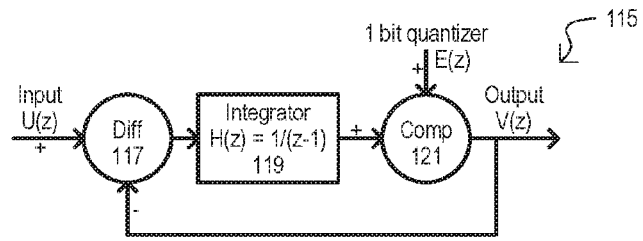
FIGS. 1A and 1B are block diagrams of a conventional sigma-delta modulator and a representation of a sigma-delta modulator that can be included in embodiments.

Various embodiments will now be described that show capacitance sensing devices and methods that can integrate both a sense capacitance and a reference capacitance, and use a difference between the resulting integration results to generate a modulated signal that represents variations in the sense capacitance. Because a difference between two integrated values is used, a reference value (e.g., reference voltage) is not needed. Further, such capacitance sensing can lack the sensitivity to variations in sampling frequency present in conventional approaches.

In some embodiments, a capacitive sensing system can be a modified implementation of a first order sigma-delta modulator which is insensitive to clock frequency variation and does not need a voltage reference. A sensing capacitance (Cx) and a reference capacitance (Cm) can be used in integrators. Modulation provided by the system can force the integrated waveform on Cm to follow the waveform on Cx, and thus generate a difference values having an average which can encode variations in Cx. In particular embodiments, a bit stream can be generated by sampling the difference values.

In the particular embodiments described herein, like items are referred to by the same reference character but with the leading digit(s) corresponding to the figure number.

To understand various aspects of the embodiments, examples of a conventional first order sigma-delta modulator will first be described. FIG. 1A is a representation of a "true" first order sigma-delta modulator 115 in a z-domain transfer block diagram. Modulator 115 can include a difference operation 117, an integration operation 119, and a 1-bit quantizing operation 121. As shown, a difference 117 can be taken between an input U(z) and an output V(z). This difference can be integrated 119 (according to the transfer function $1/(z-1)$). The integrated value can be quantized to one bit (121) to thereby provide output V(z).

Figure 1B:
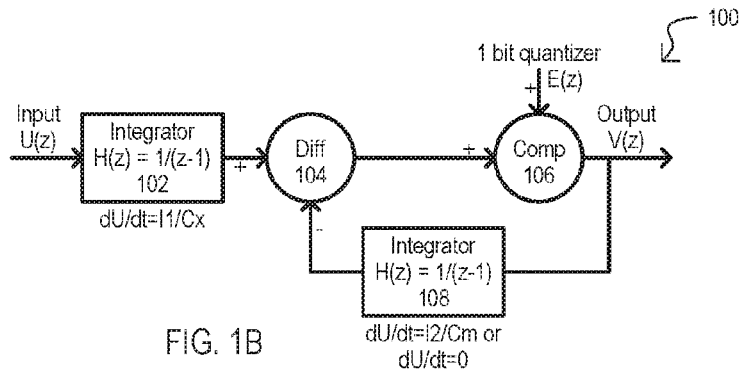

FIG. 1B shows a sigma-delta modulator 100 in a z-domain transfer block diagram that can be included in, or represent, embodiments described herein. Modulator 100 can include a first integration operation 102, a difference operation 104, a quantizing operation 106, and a second integration operation 108. As shown, an input U(z) can be subject to first integration 102 prior to any difference operation. In a particular embodiment, an integration operation 102 can be the integration of a sense capacitance Cx using a current I1 (i.e., $dU/dt=I1/Cx$).

A second integration operation 108 can integrate an output value (V(z)), which can be a quantized value. In a particular embodiment, integration operation 108 can receive a one-bit quantized value, and thus can either integrate a reference capacitance using a current I2 ($dU/dt=I2/Cm$), or no integration can occur ($dU/dt=0$).

A difference 104 can be taken between the two integration results (i.e., outputs of blocks 102 and 108). The difference result can be quantized 106, and provided as an output value (V(z)).

By performing an integration of a sense capacitance (e.g., Cx) before a difference operation U−V (such as 117 in FIG. 1A), a modulator 100 can take advantage of the fact that capacitors Cx and Cm can both perform as integrators. A resulting modulator 100 can be conceptualized as a delta-sigma analog-to-digital converter (ADC) that can convert an input I1/Cx*T (integrated voltage on a sample capacitance) using, as a reference, the voltage I2/Cm*T (integrated voltage on a reference capacitance), where T is a time period for a conversion cycle.

It is noted that an embodiment like that of FIG. 1B, or an equivalent, can have the benefits of conventional delta-sigma analog-to-digital conversion, including but not limited to averaging and noise shaping, to name but two.

Figure 2:
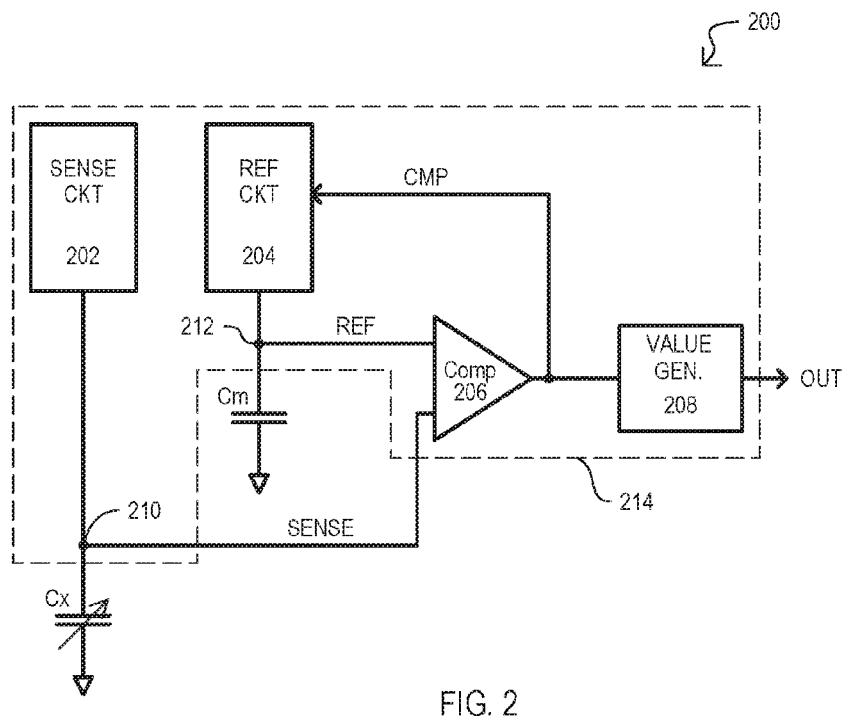
FIG. 2 is a block schematic diagram of a capacitive sense circuit according to an embodiment.

FIG. 2 is a block schematic diagram of a capacitance sense circuit 200 according to an embodiment. A circuit 200 can sense variations at a sense capacitance Cx as changes in an output value OUT. It is understood that a sense capacitance Cx can have various components. As but one example, a sense capacitance Cx can have, or can be conceptualized as having, a base component that does not change, and a variable component.

A circuit 200 can include a sense circuit 202, a reference circuit 204, a compare circuit 206, and a value generation circuit 208. A sense circuit 202 can be connected to a sense node 210. Sense node 210 can be connected to a first input of compare circuit 206. Reference circuit 204 can be connected to a reference node 212. Reference node 212 can be connected to a second input of compare circuit 206. An output of compare circuit 206 can be a compare signal CMP, which can be provided as an input to both reference circuit 204 and value generation circuit 204.

Sense node 210 can be connected to, or can be designed to connect to, a sense capacitance Cx. In a similar fashion, reference node 210 can be connected to, or can be designed to connect to, a reference capacitance Cm. According to some embodiments, a reference capacitance Cm can provide a reference signal to which a sense signal is compared.

A sense circuit 202 can generate an electrical sense signal (SENSE) on sense node 210 that varies according to sense capacitance Cx. In some embodiments, such a signal can be a voltage. However, in other embodiments, such a signal can be a current. In some embodiments, a sense circuit 202 can integrate sense capacitance Cx by charging it with a current source. In particular embodiments, a sense circuit 202 can periodically charge and then discharge sense capacitance Cx. However, in other embodiments, a sense circuit 202 can initially charge sense capacitance Cx, and then allow the sense capacitance Cx to discharge.

A reference circuit 204 can generate an electrical reference signal (REF) on reference node 212 that varies according to the reference capacitance Cm, but that also varies according to compare signal CMP. Like the SENSE signal, a REF signal can be a voltage or a current generated by charging or discharging a Cm. According to some embodiments, a REF signal can follow the form of the SENSE signal. For example, if the SENSE signal is a voltage generated by charging (or discharging) Cx, a REF signal can be a voltage generated by charging (or discharging) Cm. In some embodiments, a reference circuit 204 can selectively charge (or discharge) Cm according to comparator signal CMP. In particular embodiments, when signal CMP has one value, reference circuit 204 can charge (or discharge) Cm, but when signal CMP has another value, reference signal can cease charging (or discharging) Cm. However, in other embodiments, a reference circuit 204 can change a rate at which is charges (or discharges) Cm based on signal CMP.

A compare circuit 206 can generate compare signal CMP based on a comparison between SENSE and REF signals received from sense node 210 and reference node 212. In a particular embodiment, compare circuit 206 can be a comparator that drives signal CMP between two different values.

A value generation circuit 208 can generate an output value OUT corresponding to the compare signal CMP over a predetermined time period. According to some embodiments, output value OUT can represent the integration of signal CMP over time. In particular embodiments, output value OUT can be a digital value. However, in alternate embodiments an output value OUT can be an analog integrated value.

In some embodiments, sense circuit 202, reference circuit 204, compare circuit 206, value generation circuit 208 can be formed as part of an integrated circuit (IC) (214). Sense node 210 and reference node 212 can be, or have conductive connections to, inputs of the IC 214. In an alternate embodiment, a reference capacitance can be a capacitor formed as part of IC (214).

Figure 3A:
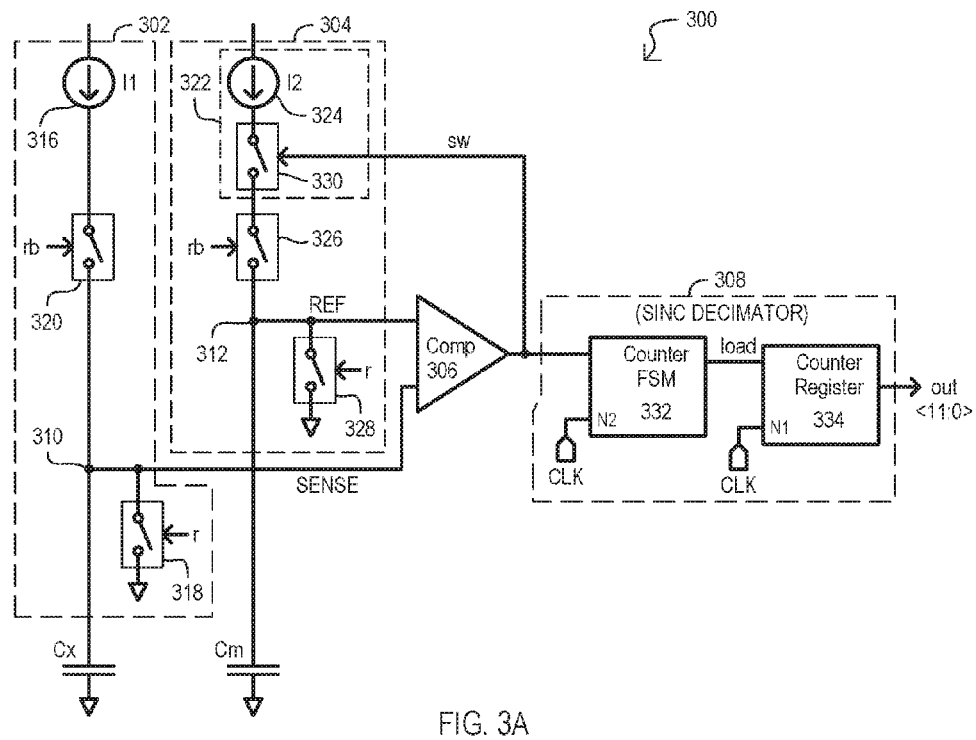
FIG. 3A is a block schematic diagram of a capacitance sense circuit according to an embodiment.
Figure 3B:
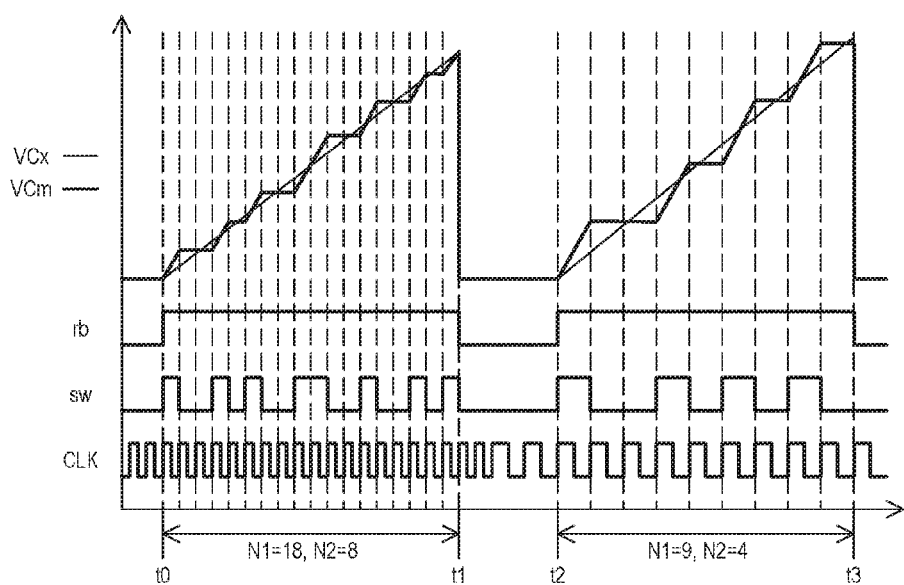
FIG. 3B is a timing diagram showing operations of a circuit like that of FIG. 3A.

FIG. 3A is a block schematic diagram of a capacitive sensing circuit 300 according to another embodiment. In one particular embodiment, circuit 300 can be one implementation of that shown in FIG. 2. FIG. 3B is a timing diagram showing possible operations of the circuit shown in FIG. 3A.

A circuit 300 can include a sense circuit 302, a reference circuit 304, a compare circuit 306 and a value generation circuit 308. A sense circuit 302 can include a first current source 316, a first reset switch 318, and a first isolation switch 320. A first isolation switch 320 can be situated between first current source 316 and sense node 310. First reset switch 318 can be connected between sense node 310 and a predetermine voltage node, which in this embodiment can be ground. First reset switch 318 can be controlled by a conversion timing signal r. First isolation switch 320 can be controlled according to another conversion timing signal rb, which can generally be the inverse of signal r.

A reference circuit 304 can include a modulating current source 322, a second isolation switch 326, and a second reset switch 328. A modulating current source 322 can selectively provide an integrating current I2 in response to a compare signal sw. In the particular implementation shown, controllable current source 322 can include a second current source 324 in series with a modulating switch 330, which can be controlled by clock signal sw. Second isolation switch 326 can be situated between modulating current source 322 and reference node 312. Second reset switch 328 can be connected between reference node 312 and a predetermine voltage node, which in this embodiment can be ground. Second reset switch 328 can be controlled by conversion timing signal r. Second isolation switch 326 can be controlled according to a conversion timing signal rb.

A sense capacitance Cx can be connected between sense node 310 and a predetermined voltage node, in this case ground. A sense capacitance Cx can take the form of any of those described herein, or equivalents. A reference capacitance Cm can be connected between reference node 312 and the predetermined voltage node. In operation, a sense voltage SENSE can be generated on sense node 310 and a reference voltage REF can be generated on reference node 312. In a particular implementation, sense capacitance Cx can be a touch sensor capacitance, which can vary in response to the proximity of a human body part (e.g., finger) while Cm can be another fixed-value capacitance. A value of Cm can be selected to be close the expected Cx.

Compare circuit 306 can have inputs connected to sense node 310 and reference node 312. Compare circuit 306 can generate a compare signal sw that represents a difference between sense voltage SENSE and a reference voltage REF. In some embodiments, compare circuit 306 can be a comparator, thus sw can vary between only two values.

Value generation circuit 308 can generate a digital output value representing the integration of the sw signal output from compare circuit 306. In the embodiment shown, value generation circuit 308 can include a counter circuit 332 and a counter register 334. A counter circuit 332 can generate a count value that can be incremented according to a clock signal CLK whenever sw (the output from compare circuit 306) has a predetermined value. Count values from counter circuit 332 can be loaded into counter register 334. The count values can be read out, or output from, counter register 334 as digital output values "out"<11:0>, which in the particular embodiment shown can be 12-bit values. However, output values of greater or smaller bit size can be generated. In some embodiments, value generation circuit 308 can include noise shaping or other like circuits to address any undesirable factors in the conversion process. In the particular embodiment shown, value generation circuit 308 can include a sinc decimator circuit, which can, in particular embodiments, include a digital low pass filter and a down sampler circuit.

A circuit 300 can be conceptualized as including both a reset phase and a measurement phase. During reset phase, both Cx and Cm can be set to an initial voltage. In the embodiment shown, this initial voltage can be generated by discharging to ground.

During a measurement phase, both Cx and Cm can charge up linearly. Cx can be charged by a constant current I1 provided by first current source 316. Cm can be charged by a constant current I2, provided by second current source 324. However, the charging of Cm can be interrupted by modulation switch 330 being opened according to compare signal sw. During a measurement phase, if Cx>Cm*I1/I2, a voltage on Cx (VCx) will start to lag behind the voltage on Cm (VCx<VCm) and compare circuit 306 will switch the value of signal sw. As a result, modulating switch 330 can open, and the charging of Cm will stop, as the current supply is interrupted. However, sense capacitance Cx will continue to be charged by first current source 316 until its voltage no longer lags that of Cm (VCx>VCm). At this point compare switch 306 with drive switch sw to the previous value, and modulating switch 330 will close, and the charging of Cm will resume. In this way, the voltage on Cm is modulated according to a difference between Cm and Cx.

FIG. 3B is a timing diagram showing one particular example of conversion operations for the embodiment of FIG. 3A. FIG. 3B includes waveforms for a voltage on Cm (VCm) superimposed with the voltage on Cx (VCx); clock signal rb; compare signal sw; and a clock signal CLK.

Prior to time t0, signal rb can be low (and signal r can be high). As a result, first and second isolation switches 320 and 326 can be open, isolating Cx from first current source 316 and isolating Cm from second current source 324. At the same time, first and second reset switches 318 and 328 can be closed, connecting Cx and Cm to ground (i.e., discharging the capacitances).

At time t0, signal rb can transition high (and signal r can go low), starting a first measurement phase. In a first cycle of CLK following t0, VCx>VCm, thus sw can be high, allowing VCm to be charged. In the next cycle of CLK, VCm exceeds VCx, causing sw to transition low, stopping the charging of VCm. This continues as described herein, with VCm continually catching up with VCx, then pausing, catching up, then pausing, etc.

At time t1, rb can transition low, ending the first measurement phase. As shown, through 18 cycles of sample clock CLK (N1), a count value of 8 is generated (N2).

Between times t1 and t2, a frequency of CLK can decrease.

At time t1, signal rb transitions high again, starting a second measurement phase. Signal sw can transition as described above, but at the lower frequency for CLK.

At time t2, rb can transition low again, ending the second measurement phase. As shown, through 9 cycles of the now slower sample clock CLK (N1'), a count value of 4 is generated (N2').

From the above description, it is understood that during a measurement phase, signal sw will be a sigma-delta modulated stream having a duty cycle (DC) given by:

$$DC = N2/N1 = (I1/I2)*(Cm/Cx), \text{ which gives}$$

$$Cx = (N1/N2)*(I1/I2)*Cm, \text{ and therefore}$$

$$\Delta Cx = (\Delta N1/N2)*(I1/I2)*Cm$$

That is, a detected difference in the sense capacitance ($\Delta Cx$) does not depend upon either Vref or Fs, as is the case for conventional approaches. Rather, results will depend upon current values I1, I2 and the value of the fixed reference capacitance Cm.

Figure 18A:
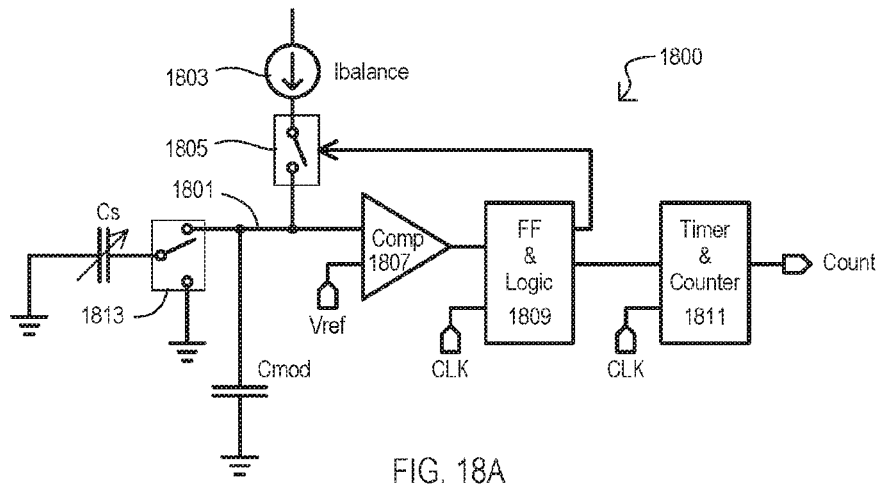
FIG. 18A is a block schematic diagram of a conventional sigma-delta capacitive sensing system.
Figure 18B:
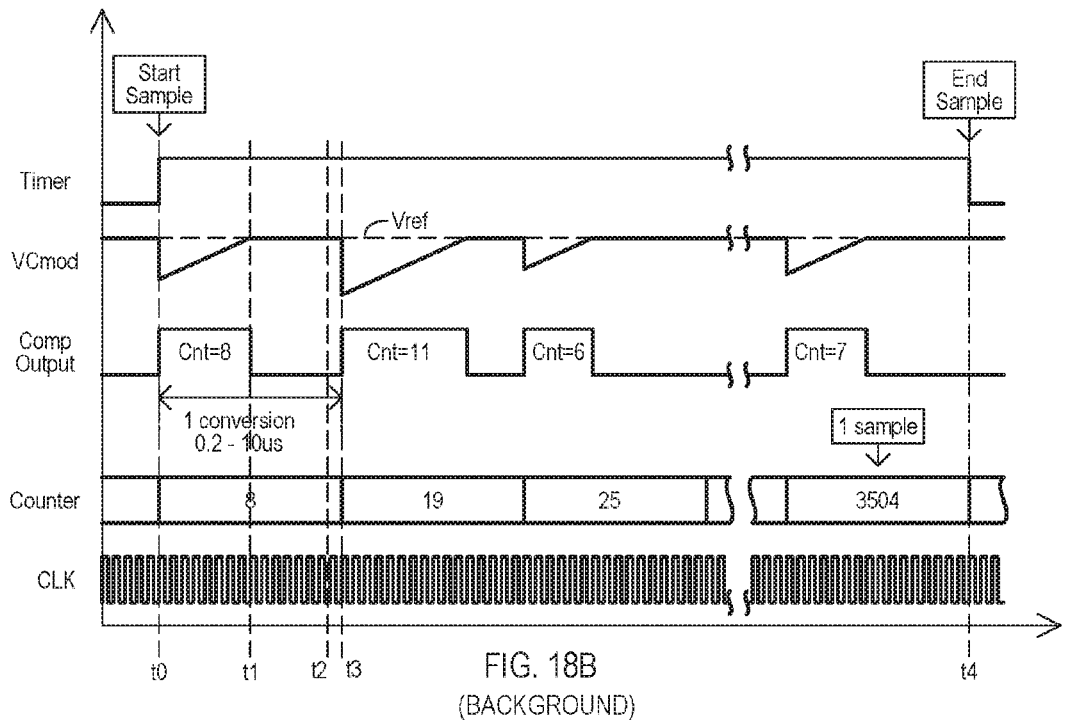
FIG. 18B is a timing diagram showing operation for a conventional system like that FIG. 18A.

The embodiment of FIG. 3A, and equivalents, is understood to be a "real" delta-sigma first order modulator, unlike the conventional approach of FIGS. 18A and 18B, which counts clocks into a Cx generated time window and then averages the results over consecutive readings. As such, the embodiment benefits from the high resolution and noise shaping advantages that come with "real" delta-sigma modulators.

In this way, a capacitance sense circuit 300 can operate in a way entirely different from conventional approaches, like that of FIGS. 18A and 18B. Instead of generating a time window and counting the clock pulses that fit in, a bit stream can be generated whose average duty cycle encodes the value of the sensing capacitance Cx. As such, it can be completely essentially insensitive to clock frequency variation, clock jitter, reference voltage variation or reference noise. Such embodiments can operate without a reference voltage, and performance can be improved over conventional approaches if a clock (CLK) is noisy.

FIGS. 4A to 4C show simulation results for the embodiment of FIG. 3A. The results reflect the following conditions, Cx=10 pF, $\Delta Cx$=0-10%, Cm=10 pF, I2/I1=3/2, I1=100 nA, 48 MHz oscillator (i.e., CLK), and 12-bit (4096 clock cycles) integration ramp. One LSB corresponds to a 0.1% change in Cx.

FIG. 4A is a graph showing VCm over the 12-bit integration ramp.

FIG. 4B shows the integral nonlinearity (INL) of the resulting conversion over the variation in Cx.

FIG. 4C shows the differential nonlinearity (DNL) of the resulting conversion over the variations in Cx.

As noted above, capacitance sense circuits according to embodiments can perform even in the presence of noisy clock signals. FIGS. 5A and 5B demonstrate such performance.

FIGS. 5A and 5B show simulation results like those of FIGS. 4B and 4C, but with a 300 ps rms cycle-to-cycle jitter in the clock signal. As shown, while DNL can be degraded, it is from about 0.5 LSB to 2 LSB.

Capacitance sense circuits according to embodiments can provide essentially total rejection of common mode noise coupled to both Cx and Cm. Differential noise, such as noise applied to Cx only, can produce only a slight degradation in INL and DNL. FIGS. 6A and 6B show such performance.

FIGS. 6A and 6B show simulation results like those of FIGS. 4A to 4C, but with the addition of 100 mV peak-to-peak 60 Hz differential noise added to VCx.

While embodiments herein can utilize a single ramp to integrate a Cx values, alternate embodiments can include continuous ramping, with VCx (and VCm) continuously ramping up and down. Continuous ramping can be used for applications that cannot provide low charging currents and/or high maximum integration voltages. For example, in order to achieve a high enough oversampling ratio (e.g., 4096 cycles), an embodiment with single ramp integration may have to employ a relatively low charging current (e.g., I1=100 nA) and relatively high supply voltages (e.g., VCxmax=4.2V). Such low charging currents may be impractical when they become comparable with leakage in a printed circuit board (PCB) which can include the capacitance sense circuit. Further, a high maximum integration voltage (VCxmax) can require the use of a charge pump in circuits operating at a lower power supply voltage (i.e., 1.2V-1.5V). This can add to the expense and complexity of a system.

FIGS. 7A and 7B are diagrams showing a continuous ramping embodiment. FIG. 7A shows a ramping voltage of VCm that ramps up and down between voltage levels of 0.3V and 0.9V (25% and 75% of a 1.2V supply). The system can use a charging current I1=500 nA, and the same OSR (4096 cycles). FIG. 7B shows the resulting DNL.

While a single ramp method can be equivalent to the conversion of a DC signal at the input of the modulator (i.e., U(z) in FIG. 1B), a continuous ramp method can be equivalent to the conversion of a square waveform input, having the frequency at fclk/N, where N=2Cx*Fclk*(Vxmax−Vxmin)/I1. In an ideal circuit, N can be a fixed integer, which causes fold back (aliasing) on the DC component and can degrade the DNL, as depicted in FIG. 7B.

Figure 8:
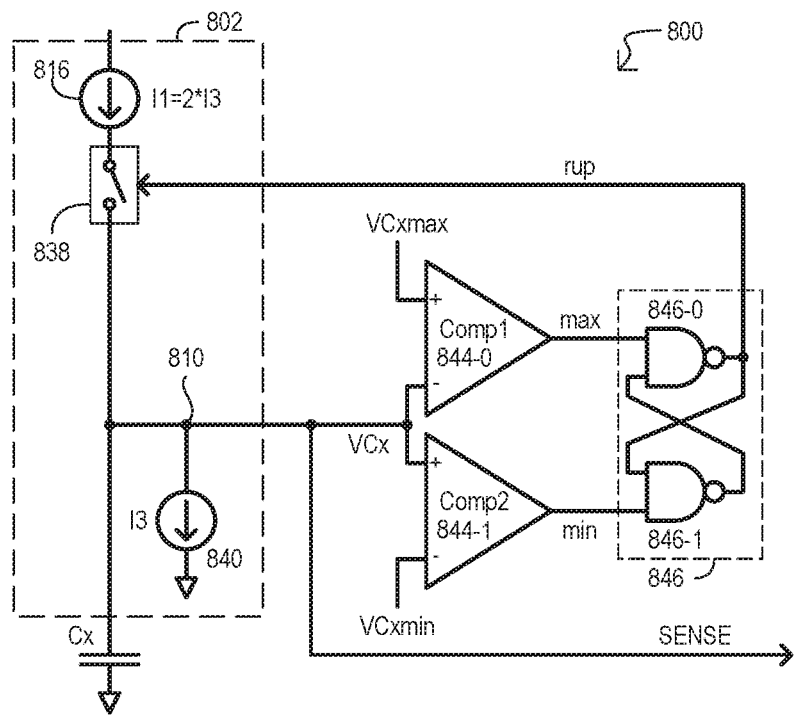
FIG. 8 is a block schematic diagram showing a continuous ramp capacitance sense circuit according to an embodiment.

FIG. 8 shows a capacitance sense circuit 800 that can provide continuous ramping according to an embodiment. Circuit 800 can include items like those of FIG. 3, and such like items can operate in a same or equivalent fashion to those described in FIG. 3.

FIG. 8 differs from FIG. 3 in that a sense circuit 802 can include a charge switch 838 and a discharge current source 840. A discharge current source 840 can source a smaller current than first current source 816. In the embodiment shown, first current source 816 can provide a current that is twice that provided by discharge current source 840 (I1=2*I3).

Referring still to FIG. 8, when a signal "rup" is active, charge switch 838 can be closed, resulting in sense capacitance Cx being charged by first current source 816 "overpowering" discharge current source 840, for a ramp up response. When signal "rdn" is active, charge switch 838 can be open, enabling discharge current source 840 to discharge node 810, resulting in sense capacitance Cx being discharged to ground, creating a ramp down response.

FIG. 8 also shows a first level comparator 844-0, second level comparator 844-1, and interlock logic 846. In the particular embodiment shown, interlock logic 846 can include cross-coupled NAND gates 846-0/1. When a voltage VCx is greater than a maximum value (VCxmax), an output of first comparator 844-0 (max) can be active. When a VCx is less than a minimum value (VCxmin), an output of second comparator 844-0 (min) can be active. By operation of interlock logic 846, when VCx rises to VCxmax, rup will be deactivated, and when VCx falls to VCxmin, rup will be activated. Sense node 810 can provide a SENSE signal which can be compared to a reference signal REF signal as described for embodiments herein, or equivalents.

Figure 9:
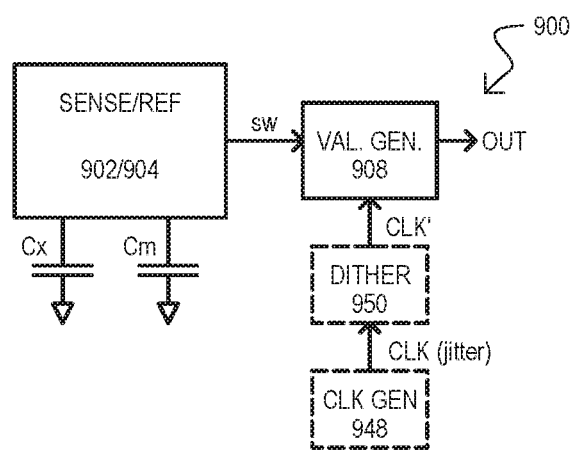
FIG. 9 is a block schematic diagram showing continuous ramp capacitance sense circuits according to other embodiments.

As noted above in conjunction with FIGS. 7A and 7B, in embodiments employing continuous ramping, there can be some degradation in DNL. Alternate embodiments can include continuous ramping, but also employ additional features to improve a conversion response. FIG. 9 shows two examples of possible additions; a high jitter clock and clock dithering.

FIG. 9 is a block schematic diagram of a capacitance sense circuit 900 according to embodiments. Circuit 900 can include sense circuits and reference circuits 902/904 that can sense changes in a sense capacitance Cx using continuous ramping as described for embodiment herein, or equivalents. Such circuits can generate a modulated output value sw which can be received by a value generation circuit 908. Value generation circuit 908 can sample value sw according to a clock CLK' to generate an output value OUT.

According to one embodiment, a circuit 900 can include a clock generation circuit 948, such as an oscillator circuit for example, that provides a clock signal having a relatively high amount of jitter.

Alternatively, or in addition, a circuit 900 can include a clock dithering circuit 950. Such a dithering circuit 950 can add dithering to a generated clock signal before applying it to value generation circuit 908.

In this way, continuous ramp capacitance sense circuits can intentionally alter a clock signal used to sample an incoming modulated signal.

FIG. 10A shows the DNL of a continuous ramp system like that of FIG. 7B (OSR=4096), but with the introduction of 300 ps rms clock jitter. As shown, the inclusion of clock jitter results in an improvement in DNL over the no jitter case.

FIGS. 10B and 10C show responses for the same system as FIG. 10A (i.e., one that introduces clock jitter), but with a greater OSR (OSR=65536). FIG. 10B shows the INL of the response. FIG. 10C shows the DNL of the response.

FIGS. 11A to 11C shows responses of a ramp system like that of FIG. 7B, but with the introduction of clock dithering. FIGS. 11A and 11B show responses for clock dithering between 46 MHz and 48 MHz by using a 1-bit pseudo-random sequence generator (i.e., frequency hopping). Sampling was performed with OSR=65536 (16-bits). FIG. 11A shows a resulting INL. FIG. 11B shows a resulting DNL.

FIG. 11C shows a transfer characteristic of an ideal response 1154 versus that of a real response 1156 with the above noted clock dithering. As shown, there can be no flat/dead region in the transfer characteristic (i.e., the circuit response has no horizontal segment around the origin or anywhere else). It is believed, the INL characteristics described herein shown that frequency dithering may not be necessary to eliminate flat/dead regions in the transfer characteristic, whereas such clock dithering can be necessary in conventional approaches.

Figure 12:
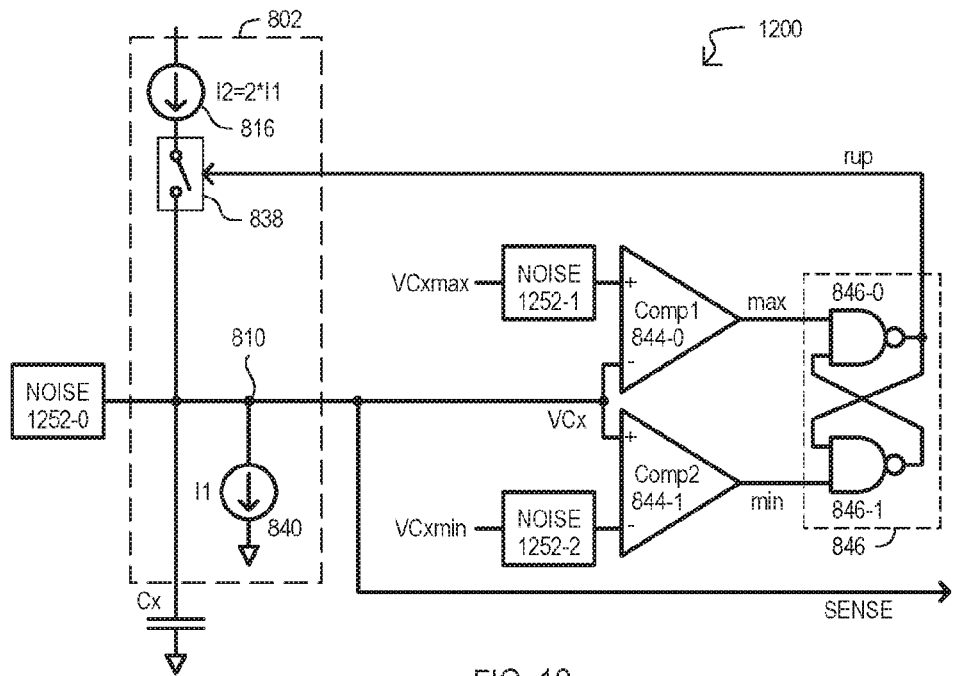
FIG. 12 is a block schematic diagram showing a continuous ramp capacitance sense circuit according to other embodiments that can inject noise to improve performance.

While some continuous ramping embodiments can modify a sample clock to improve performance, other embodiments can add noise to improve performance. FIG. 12 shows examples of such embodiments.

FIG. 12 shows a capacitance circuit 1200 providing continuous ramping according to an embodiment. Circuit 1200 can include items like those of FIG. 8, and such like items can operate in a same or equivalent fashion to those described in FIG. 8.

FIG. 12 differs from FIG. 8 in that one or more noise circuits 1252-0 to -2 can be included. According to some embodiments, noise, such as white noise, can be injected onto a sample capacitance Cx. In the embodiment of FIG. 12, a noise generation circuit 1252-0 can be included to add noise to sense node 810.

In addition or alternatively, noise can be injected into the comparators that limit VCx. In the embodiment of FIG. 12, a noise generation circuit 1252-1 and/or a noise generation circuit 1252-2 can be included to add noise to inputs of first level comparator 844-0 and/or second level comparator 844-1.

Figure 13:
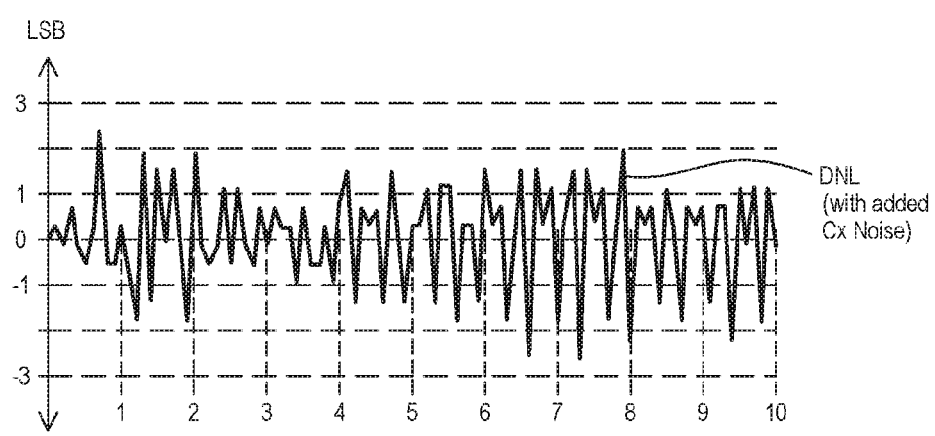
FIG. 13 is a diagram showing simulation results for an embodiment like that shown in FIG. 12 that adds noise to improve performance.

FIG. 13 shows the DNL of a continuous ramp system like that of FIG. 7B (OSR=4096), but with differential noise injected on Cx. The differential noise was 100 mVpp at 60 Hz. Such noise can slightly modify N from one ramp to the next, thus preventing DC aliasing.

In the various simulation responses shown in FIGS. 7B, 10A to 11C and 13, an output value was obtained by accumulating a bit stream at the output of a comparator (sinc decimator). However, alternate embodiments can include a sinc2 type decimator. Use of a sinc2 decimator can result in even better DNL performance.

Figure 14:
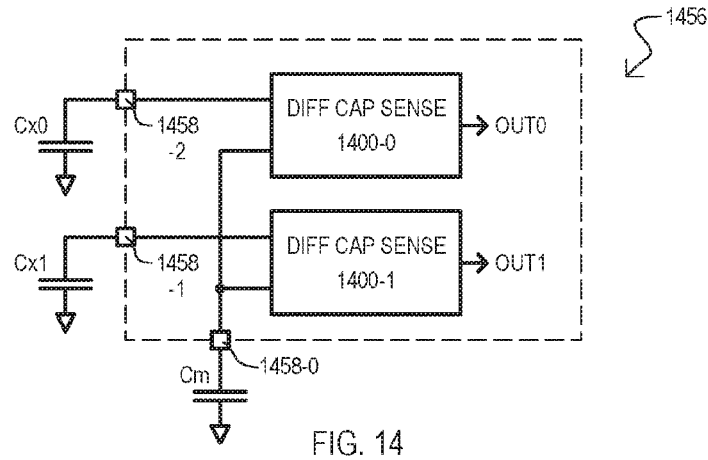
FIG. 14 is a block schematic diagram showing a capacitance sensing device with a shared reference capacitance according to an embodiment.

While embodiments described herein have included one sense capacitance Cx and one reference capacitance Cm, other embodiments can use one reference capacitance for multiple sense capacitances. FIG. 14 show such an embodiment.

FIG. 14 shows a device 1456 that can include multiple differential sigma-delta capacitance sensing circuits according to any of the embodiments disclosed herein, or equivalents. FIG. 14 shows two such circuits 1400-0/1, but it is understood that more than two could be included. Capacitance sense circuit 1400-0 can have an input connected to a first sense capacitance Cx0, and can generate an output value OUT0 that can indicate changes in Cx0. Capacitance sense circuit 1400-0 can also be connected to a reference capacitance Cm. Another capacitance sense circuit 1400-1 can have an input connected to a second sense capacitance Cx1, and can generate an output value OUT1 that can indicate changes in Cx1. Capacitance sense circuit 1400-1 can also be connected to a reference capacitance Cm. In this way, a reference capacitance Cm can be shared among multiple differential sigma-delta capacitance sensing circuits.

Any or all capacitances Cx0, Cx1, Cm can be capacitances connected to a device 1456 at external connections, including but not limited to circuit board traces, integrated circuit (IC) connections (such as pins, bond pads, etc.). In the particular embodiment of FIG. 14, Cm, Cx0, Cx1 can be external capacitances connected to device 1456 at external connections 1458-0, 1458-1 and 1458-2, respectively.

Figure 15:
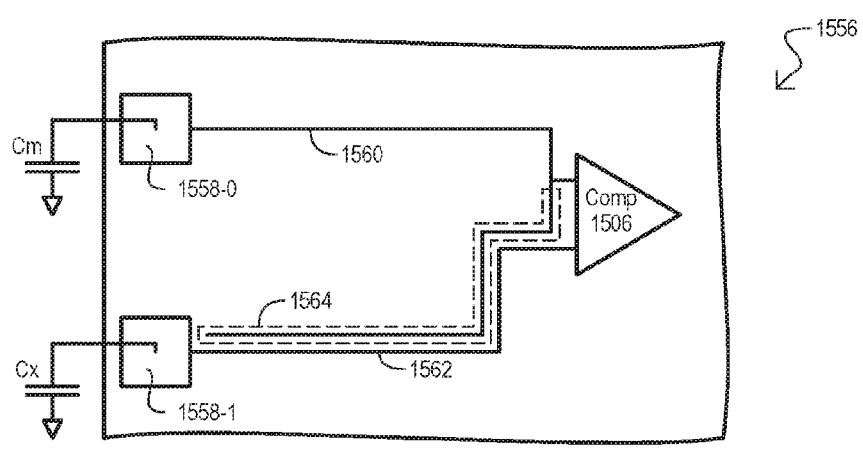
FIG. 15 is a plan view showing a capacitance sensing device with a dummy input line according to an embodiment.

FIG. 15 shows a device 1556 according another embodiment. A device 1500 can be an electronic device having conductive connections between components. It is understood such connections can be at the circuit board level, IC package level, or within an IC itself (i.e., metallization layers). A device 1556 can include a compare circuit 1506 that forms part of a differential sigma-delta capacitance sense circuit according to any of the embodiments herein, or equivalents.

A reference capacitance Cm can be connected to device 1556 at an external connection 1558-0. External connection 1558-0 can be conductively connected to a reference input of compare circuit 1506 by a reference conductive line 1560. A sense capacitance Cx can be connected to device 1556 at an external connection 1558-1. External connection 1558-1 can be conductively connected to a sense input of compare circuit 1506 by a sense conducive line 1562.

In addition, a device 1556 can include a dummy conductive line 1564, which can be conductively connected to the reference input of compare circuit 1506. Dummy conductive line 1564 can run parallel to all, or a portion of sense conductive line 1562. Such an arrangement can match noise at the inputs of compare circuit 1506 that is capacitively coupled to Cx or Cm.

While the above embodiments have shown circuits, devices, systems and corresponding methods, an additional method will now be described with reference to FIG. 16.

Figure 16:
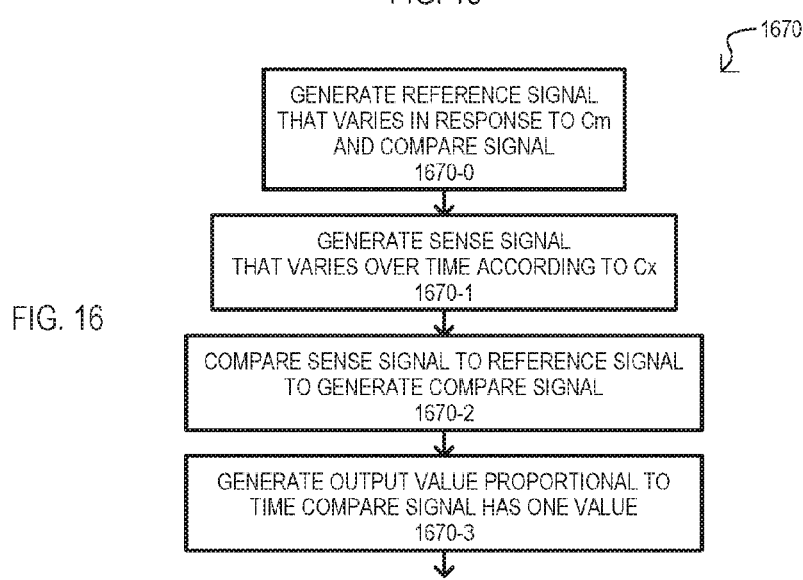
FIG. 16 is a flow diagram of a method according to an embodiment.

FIG. 16 is a flow diagram of a method 1670 according to an embodiment. A method can include generating a reference signal that varies in response to a reference capacitance and a compare signal (1670-0). In some embodiments, such an action can include changing the reference signal in one way when the compare signal has one value, and then changing it in another way when the compare signal has another value. In some embodiments, such an action can include changing the magnitude of the reference signal when the compare signal has one value, and then halting such changes when the compare signal has another value. In very particular embodiments, such an action can include charging Cm to cause a rising reference signal when the compare signal has one value and then ceasing such charging when the compare signal has another value. In addition or alternatively, Cm can be discharged to cause a falling reference signal when the compare signal has one value, and then such discharging can be ceased when the compare signal has another value.

A method 1670 can further include generating a sense signal that varies over time according to a sense capacitance Cx (1670-1). In some embodiments, such an action can include changing the magnitude of the sense signal at a rate that corresponds to Cx. In particular embodiments, such an action can include charging Cx to cause a rising sense signal and/or discharging Cx to cause a falling sense signal.

A method 1670 can compare a reference signal to a sense signal to generate the compare signal (1670-2). In some embodiments, such an action can include driving the compare signal to one value when a sense signal is greater than a reference signal, and driving the compare signal to another value when a sense signal is not greater than a reference signal.

A method 1670 can further include generating an output value proportional to the time the compare signal has one value (1670-3). Such an action can include accumulating compare signal values to generate the output value. In a particular embodiment, such an action can include sampling the compare signal at a predetermined clock rate.

Figure 17:
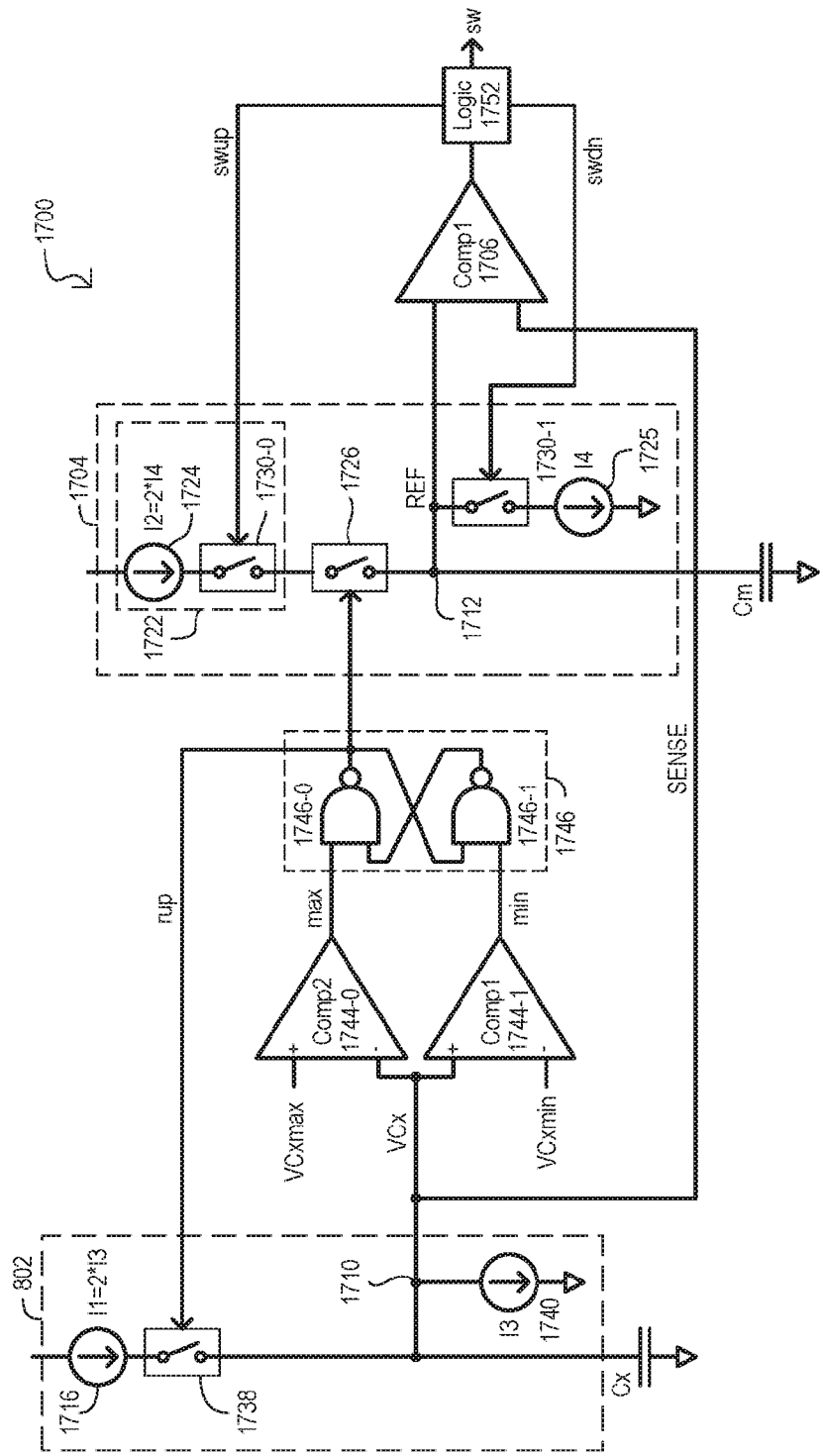
FIG. 17 is a block schematic diagram of a continuous ramp capacitance sense circuit according to another embodiment.

FIG. 17 is a block schematic diagram of a capacitive sensing circuit 1700 according to a particular embodiment. A circuit 1700 can employ continuous ramp type measuring to generate a modulated output value sw that can reflect changes in a sense capacitance Cx. Circuit 1700 can include items like those of FIGS. 3 and 8, and such like items can operate in the same or an equivalent fashion.

FIG. 17 differs from FIGS. 3 and 8 in that circuit 1700 can include second modulating switch 1730-1 in addition to a first modulating switch 1730-0, as well as a reference discharge current source 1725 and switching logic 1752 at the output of compare circuit 1706. According to embodiments, a current source ratio in sense circuit 802 can match that in reference circuit 804. In the very particular embodiment, such a ratio can be 2:1, with I1=2*I3 and I2=2*I4.

First modulating switch 1730-0 can selectively enable second current source 1724 according to signal swup, which can be active when sense signal SENSE is rising. Accordingly, on a ramp up portion of an integration operation, a circuit 1700 can operate like that of FIG. 3.

Second modulating switch 1730-1 can selectively discharge reference capacitance Cm according to signal swdn, which can be active when sense signal SENSE is falling. Accordingly, on the ramp down portion of an integration operation, while a voltage on Cx (VCx) is less than the voltage of Cm (VCx<VCm), signal swdn can enable second modulating switch 1730-1, causing Cm to discharge. Once VCx>VCm, second compare circuit 1706-1 in combination with switching logic 1752, can switch the value of signal swdn. As a result, second modulating switch 330-1 can open, and the discharging of Cm will stop. This can continue, with Cm being periodically discharged to enable it to fall below the voltage on Cx, as Cx itself is falling.

In this way, the voltage on Cm is modulated according to a difference between Cm and Cx on both ramp up and ramp down portions of a sensing operation.

In the embodiment shown, outputs of the compare circuits (swup and swdn) can be logically combined by switching logic 1752 to create a signal sw that includes modulated signals from both ramp up and ramp down operations. A signal sw can then be provided to a value generation circuit according to any of the embodiments described herein, or equivalents.

It is understood that FIG. 17 shows but one, very particular embodiment employing continuous ramping, and should not be construed as limiting.

Embodiments described herein can provide sigma-delta modulated capacitance sensing that does not require a reference voltage. As a result, there can be little or no need for the inclusion or use of such references circuits, or for periodic baseline recalibration. Further, conversion results are not dependent upon a highly stable sampling frequency. As a result, circuit designs can be smaller and/or less complex. In the place of low-jitter and stable frequency oscillators, embodiments can use smaller, less complex higher jitter oscillators. Further, such higher jitter oscillators can actually improve performance as shown herein.

As demonstrated from simulation results herein, embodiments can provide similar or better than the results than conventional approaches (senses 0.2% Cx variation), but require far less performance from support circuitry (oscillator, reference generator, etc.).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
   a reference circuit configured to connect to a reference capacitance, and to generate an electrical reference signal that varies over time according to the reference capacitance and a compare signal;
   a sense circuit configured to connect to a sense capacitance, and to generate an electrical sense signal that varies over time according to the sense capacitance;
   a compare circuit including two separate compare inputs coupled to receive the sense signal and the reference signal respectively, and a compare output that provides the compare signal; and
   a value generation circuit configured to generate an output value proportional to the compare signal over a predetermined time period.

2. The IC device of claim 1, wherein:
   the reference circuit is configured to,
   in response to the compare signal having a first value, change the reference signal at a rate corresponding to the reference capacitance, and
   in response to the compare signal having a second value, cause a response in the reference signal that is different from that when the compare signal has the first value; and
   the sense circuit is configured to change the sense signal at a rate corresponding to the sense capacitance.

3. The IC device of claim 2, wherein:
   the reference circuit is configured to
   in response to the compare signal having the first value, increase the magnitude of the reference signal according to the sense capacitance, and
   in response to the compare signal having the second value, maintaining the reference signal at about its current magnitude.

4. The IC device of claim 1, wherein:
   the reference circuit includes a first current source, coupled to a reference node, that is enabled and disabled in response to the compare signal;
   the sense circuit includes a second current source coupled to a sense node; and
   the compare circuit has a first input coupled to the sense node and a second input coupled to the reference node; wherein
   the sense node is configured to connect to the sense capacitance and the reference node is configured to connect to the reference capacitance.

5. The IC device of claim 4, wherein:
   the reference circuit further includes a first reset switch coupled between the reference node and a predetermined voltage node, and having a control input coupled to receive a timing signal; and
   the sense circuit further includes a second reset switch coupled between the sense node and the predetermined voltage node, and having a control input coupled to receive the timing signal.

6. The IC device of claim 4, wherein:
   the reference circuit further includes a first isolation switch coupled between the first current source and the reference node, and having a control input coupled to receive a timing signal; and
   the sense circuit further includes a second isolation switch coupled between the second current source and the sense node, and having a control input coupled to receive the timing signal.

7. The IC device of claim 1, wherein:
   the value generation circuit comprises a counter circuit that generates a digital count value proportional the compare signal over the predetermined time period.

8. A system, comprising:
   at least one sense capacitance;
   a reference capacitance; and
   at least one capacitance sense section that includes
   a reference section configured to generate an electrical reference value that varies over time according to the reference capacitance and a compare value;
   at least one sense section configured to generate an electrical sense value that varies over time according to the sense capacitance;
   a compare section configured to generate the compare value in response to a comparison between the sense value and the reference value; and a value generation section configured to generate an output value corresponding to the compare value over a predetermined time period.

9. The system of claim 8, wherein:
the sense capacitance comprises a base capacitance that can vary in response to an input to the system; and
the reference capacitance has a capacitance within 15% of the base capacitance.

10. The system of claim 8, wherein:
the value generation section includes a counter coupled to receive the compare value and a clock signal; and
a clock circuit configured to generate a clock signal with a variable frequency.

11. The system of claim 10, wherein:
the clock circuit is selected from the group of: a clock circuit having jitter of less than 10% between duty cycles rms and a clock dithering circuit that varies clock periods to within 15% of one another.

12. The system of claim 8, further including:
a noise circuit configured to inject noise into at least the sense node.

13. The system of claim 8, wherein:
the at least one capacitance sense section includes a plurality of capacitance sense sections, each coupled to the same reference capacitance and each coupled to a different sense capacitance.

14. The system of claim 8, wherein:
the sense section includes a connection line that provides a conductive connection between the sense capacitance and one input of the compare section; and
the reference section includes a conductive dummy line having a conductive connection to another input of the compare section and including a portion that runs parallel to at least a portion of the connection line.

15. A method, comprising:
generating an electrical reference signal, by operation of a reference circuit, that varies in response to a sense capacitance and a compare signal;
generating an electrical sense signal that varies over time according to a sense capacitance;
comparing the sense signal with the reference signal, by operation of a compare circuit, to generate the compare signal; and
generating an output value corresponding to the compare signal having a particular value over a predetermined time period.

16. The method of claim 15, wherein:
the sense signal is a voltage;
the reference signal is a voltage; and
the output value is a digital value.

17. The method of claim 15, wherein:
when the compare signal has a first value, the reference signal magnitude changes at a rate that varies according to the reference capacitance; and
when the compare signal has a second value, the reference signal response is different from that when the compare signal has the first value.

18. The method of claim 15, wherein:
when the compare signal has the first value, the reference signal magnitude changes at a rate according to the reference capacitance;
when the compare signal has the second value, the reference signal magnitude remains substantially unchanged; and
the sense signal magnitude changes at a rate according to the sense capacitance.

19. The method of claim 15, wherein:
generating the sense signal further includes periodically returning 30 the sense signal to a reference value; and
generating the reference signal further includes periodically returning the reference signal to the reference value at about the same time the sense signal is returned to the reference value.

20. The method of claim 15, wherein:
generating the output value includes incrementing a count value according to a count clock when the compare signal has first value, and not incrementing the count value when the compare signal has a second value.

* * * * *

UNITED STATES PATENT AND TRADEMARK OFFICE
CERTIFICATE OF CORRECTION

PATENT NO. : 9,639,226 B2
APPLICATION NO. : 14/965165
DATED : May 2, 2017
INVENTOR(S) : Iulian C. Gradinariu It is certified that error appears in the above-identified patent and that said Letters Patent is hereby corrected as shown below:

In the Claims

Column 16, Line 29, Claim 19, "returning 30 the sense signal to a reference value; and" to read as --returning the sense signal to a reference value; and--.

Signed and Sealed this
Twenty-second Day of May, 2018

Andrei Iancu
*Director of the United States Patent and Trademark Office*